(12) United States Patent
Berman et al.

(10) Patent No.: US 11,546,000 B2
(45) Date of Patent: Jan. 3, 2023

(54) MOBILE DATA STORAGE

(71) Applicant: SAMSUNG ELECTRONICS CO., LTD., Suwon-si (KR)

(72) Inventors: Amit Berman, Ramat Gan (IL); Ariel Doubchak, Herzliya (IL); Eli Haim, Raanana (IL); Evgeny Blaichman, Tel Aviv (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 235 days.

(21) Appl. No.: 16/865,891

(22) Filed: May 4, 2020

(65) Prior Publication Data

US 2021/0344356 A1 Nov. 4, 2021

(51) Int. Cl.
*H03M 13/15* (2006.01)
*G06N 3/08* (2006.01)
(Continued)

(52) U.S. Cl.
CPC ......... *H03M 13/1515* (2013.01); *G06N 3/08* (2013.01); *G11C 7/02* (2013.01);
(Continued)

(58) Field of Classification Search
CPC ......... H03M 13/1515; H03M 13/1105; H03M 13/3927; H03M 13/2909; H03M 13/13;
(Continued)

(56) References Cited

U.S. PATENT DOCUMENTS

| | | | |
|---|---|---|---|
| 2009/0241009 A1* | 9/2009 | Kong | G06F 11/1072 714/763 |
| 2013/0238959 A1* | 9/2013 | Birk | G06F 11/1068 714/773 |

(Continued)

OTHER PUBLICATIONS

Barto, et al., "Recent Advances in Hierarchical Reinforcement Learning", Discrete Even Dynamic Systems: Theory and Applications, 13, 41 -77, 2003.

(Continued)

*Primary Examiner* — Thien Nguyen
(74) *Attorney, Agent, or Firm* — F. Chau & Associates, LLC

(57) ABSTRACT

A mobile electronic device may include a memory device and a memory controller including an error correction code (ECC) encoder to encode data, a constrained channel encoder configured to encode an output of the ECC encoder based on one or more constraints, a reinforcement learning pulse programming (RLPP) component configured to identify a programming algorithm for programming the data to the memory device, an expectation maximization (EM) signal processing component configured to receive a noisy multi-wordline voltage vector from the memory device and classify each bit of the vector with a log likelihood ration (LLR) value, a constrained channel decoder configured to receive a constrained vector from the EM signal processing component and produce an unconstrained vector, and an ECC decoder configured to decode the unconstrained vector. A machine learning interference cancellation component may operate based on or independent of input from the EM signal processing component.

15 Claims, 15 Drawing Sheets

(51) Int. Cl.
*G11C 7/02* (2006.01)
*G11C 11/4074* (2006.01)
*G11C 11/408* (2006.01)
*H03M 13/11* (2006.01)
*H03M 13/39* (2006.01)

(52) U.S. Cl.
CPC ...... *G11C 11/4074* (2013.01); *G11C 11/4085* (2013.01); *H03M 13/1105* (2013.01); *H03M 13/3927* (2013.01)

(58) Field of Classification Search
CPC ........ G06N 3/08; G06N 3/0454; G06N 7/005; G06N 20/00; G06N 3/006; G11C 7/02; G11C 11/4074; G11C 11/4085; G11C 16/0483; G11C 2029/0411; G11C 7/1006; G11C 11/54; G11C 11/5642; G11C 16/26; G11C 16/08; G06F 3/0658; G06F 3/0659; G06F 11/1044; G06F 11/1072
See application file for complete search history.

(56) References Cited

U.S. PATENT DOCUMENTS

| | | | | |
|---|---|---|---|---|
| 2015/0229337 A1* | 8/2015 | Alhussien | ............. | H03M 13/35 714/773 |
| 2017/0123900 A1* | 5/2017 | Zhao | .................. | H03M 13/1111 |
| 2017/0300256 A1* | 10/2017 | Kashyap | ............... | G06F 3/0679 |
| 2018/0189125 A1 | 7/2018 | Karlik et al. | | |
| 2019/0319637 A1* | 10/2019 | Anderson | ........... | H03M 13/658 |
| 2020/0210816 A1* | 7/2020 | Luo | .................... | H03M 13/6597 |
| 2020/0293224 A1* | 9/2020 | Huang | .................. | G06F 3/0679 |

OTHER PUBLICATIONS

Dietterich, "Hierarchical Reinforcement Learning With the Maxq Value Function Decomposition", Journal of Artificial Intelligence Research 13 (2000), 227-303.

Seo, et al., "Decoding of Polar Code By Using Deep Feed-Forward Neural Networks", 2018 Workshop on Computing, Networking and Communications (CNC), pp. 238-242.

Sutton, et al., "Between Mdps and Semi-MDPS: A Framework for Temporal Abstraction in Reinforecement Learning", Artificial Intelligence 112 (1999) 181-221.

Xu, et al., "Improved Polar Decoder Based on Deep Learning", IEEE, 2017, 6 pages.

European Search Report dated Mar. 4, 2022 in related European Patent Application No. 21168170.5 (10 pages).

Parr, et al., "Reinforcement Learning With Hierarchies of Machines", Computer Science Division, UC Berkely, pp. 1043-1049; found on the internet: https://proceedings.neurips.cc/paper/1997/file/5ca3e9b122f61f8f06494c97b1 afccf3-Paper.pdf.

European Search Report dated Mar. 3, 2022 in related European Patent Application No. 21168170.5 (10 pages).

* cited by examiner

MOBILE DATA STORAGE

BACKGROUND

The following relates generally to data storage, and more specifically to data storage for a mobile device.

Memory devices are commonly used electronic components for storing data. NAND flash memory devices allow several bits of data to be stored in each memory cell, providing improvements in manufacturing costs and performance. A memory cell in which multiple bits of data are stored may be referred to as a multi-level memory cell. A multi-level memory cell partitions a threshold voltage range of a memory cell into several voltage states, and data values written to the memory cell are extracted using the memory cell voltage levels.

However, storing multiple bits per memory cell may decrease the dynamic voltage range of each voltage state, making the memory cells more susceptible to noise. Compensating for this noise may require increased computational power, which may hinder performance in a mobile device. Therefore. There is a need in the art for reliable, low power multi-cell memory systems for use in mobile electronic devices.

SUMMARY

A mobile electronic device for data storage for a mobile device is described. Embodiments of the mobile electronic device may include a memory device, a memory controller comprising a processor and an internal memory and configured to operate the memory device, the memory controller including an error correction code (ECC) encoder configured to encode data for programming to the memory device, a constrained channel encoder configured to encode an output of the ECC encoder based on one or more constraints for programming to the memory device, a reinforcement learning pulse programming (RLPP) component configured to identify a programming algorithm for programming the data to the memory device, a constrained channel decoder configured to receive a constrained vector and produce an unconstrained vector, and an ECC decoder configured to decode the unconstrained vector. Some examples include an expectation maximization (EM) signal processing component configured to receive a noisy multi-wordline voltage vector from the memory device and classify each bit of the vector with a log likelihood ration (LLR) value.

A method of programming data to a memory device is described. Embodiments of the method may receive a block of data, encode the block of data based on an ECC coding scheme, encode the block of data based on a constrained coding scheme, and program the encoded block of data to a memory device using RLPP.

A method reading data from a memory device is described. Embodiments of the method may read a block of data from a memory device, process the block of data using EM signal processing to classify each bit of the block of data with an LLR value, decode the block of data based on a constrained coding scheme, and decode the block of data based on an ECC coding scheme.

BRIEF DESCRIPTION OF THE DRAWINGS

Features of the present inventive concept will become more apparent by describing in detail exemplary embodiments thereof with reference to the accompanying drawings.

DETAILED DESCRIPTION

Figure 1:
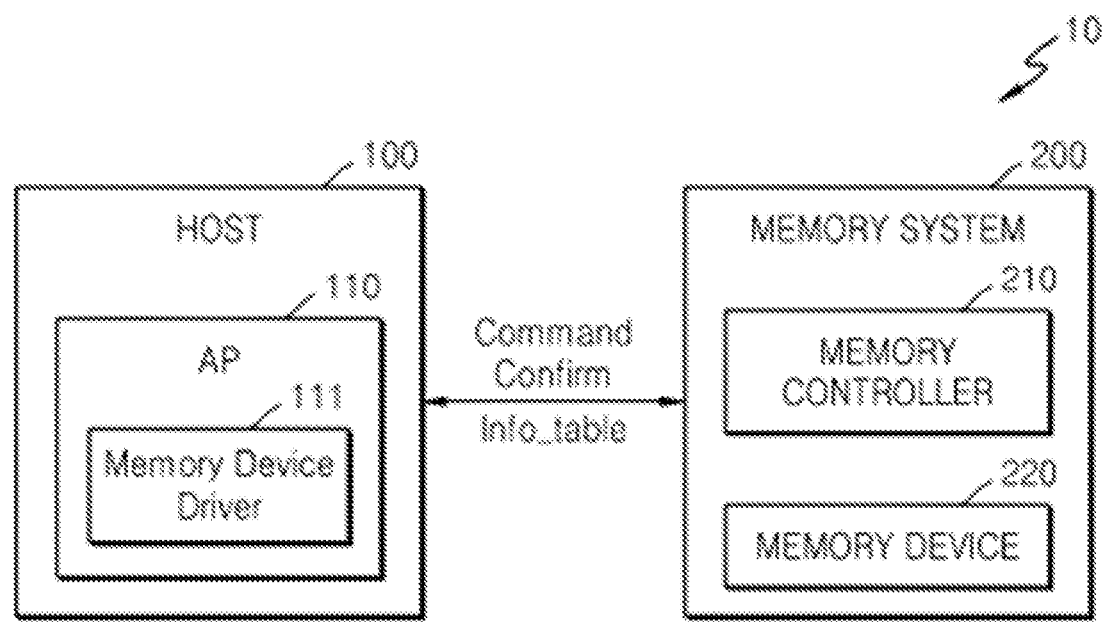
FIG. 1 is a block diagram illustrating an implementation of a data processing system including a memory system, according to an exemplary embodiment of the inventive concept.

The present disclosure relates to system and methods for programming and reading data from a memory device. Certain embodiments of the disclosure specifically relate to NAND Flash memory devices capable of storing 5 or 6 bits of data in each memory cell.

NAND programming is a complex process based on applying a voltage to a memory cell. However, cell voltage may be affected by variables such as current voltage level, pulse power, and inter cell interferences. Cell voltage may also be affected by inhibited cell disruption, inter word-line (WL) coupling, and cell retention. Additionally, the outcome of writing to a NAND device is stochastic. For example, data may also be noisy, leading to problems with observation.

Thus, the present disclosure describes systems and methods for reliably programming and reading data from a 5 or 6-bit memory device. Specific embodiments relate to a memory device designed for use in a mobile architecture.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Exemplary Memory System

FIG. 1 is a block diagram illustrating an implementation of a data processing system including a memory system, according to an exemplary embodiment of the inventive concept.

Referring to FIG. 1, the data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, exemplary embodiments of the inventive concept will be described as including a memory device that is a non-volatile memory. However, exemplary embodiments are not limited thereto. For example, the memory system 200 may include a memory device that is a volatile memory.

According to exemplary embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device. Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) mounted on, for example, a mobile device, or a central processing unit (CPU) included in a computer system.

As described above, the host 100 may include an AP 110. The AP 110 may include various intellectual property (IP) blocks. For example, the AP 110 may include a memory device driver 111 that controls the memory system 200. The host 100 may communicate with the memory system 200 to transmit a command related to a memory operation and receive a confirm command in response to the transmitted command. The host 100 may also communicate with the memory system 200 with regard to an information table related to the memory operation.

The memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command, or may provide read data to the memory controller 210 in response to the internal command.

Figure 4:
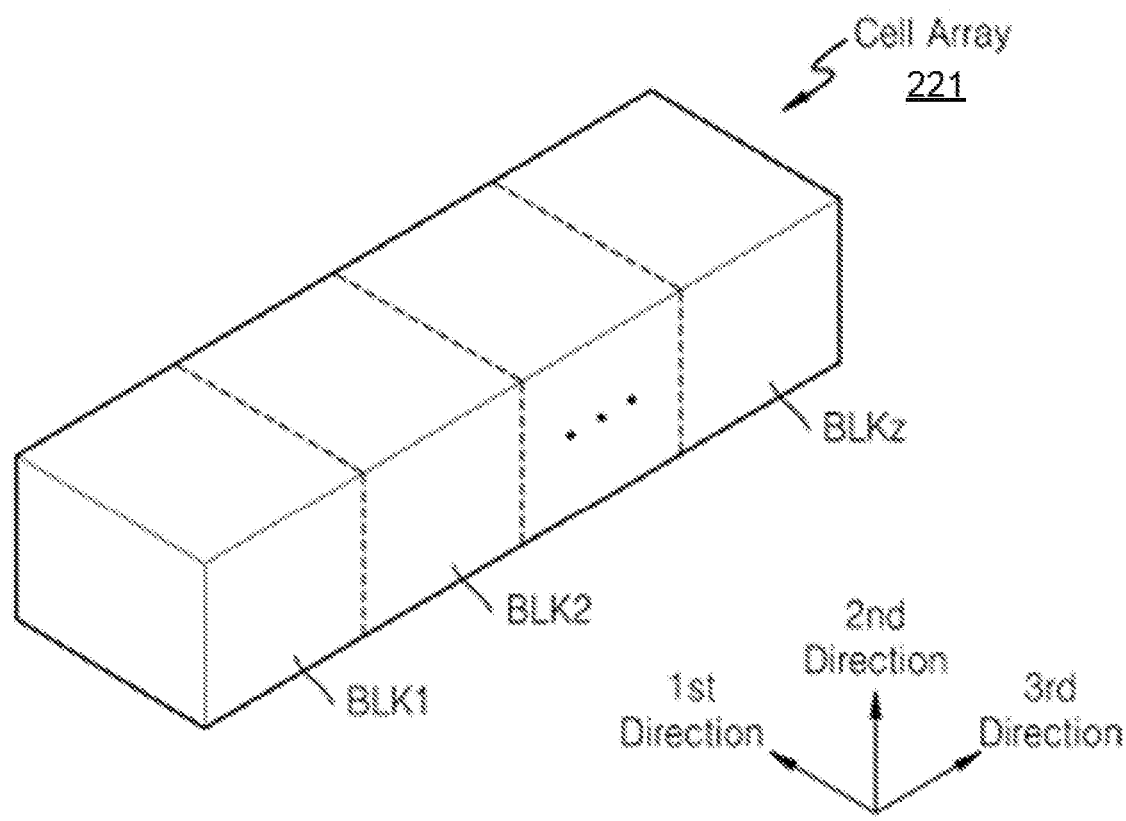
FIG. 4 is a block diagram of the memory cell array of FIG. 2, according to an exemplary embodiment of the inventive concept.

The memory device 220 includes a memory cell array that retains data stored therein, even when the memory device 220 is not powered on. The memory cell array may include as memory cells, for example, a NAND or NOR flash memory, a magneto-resistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
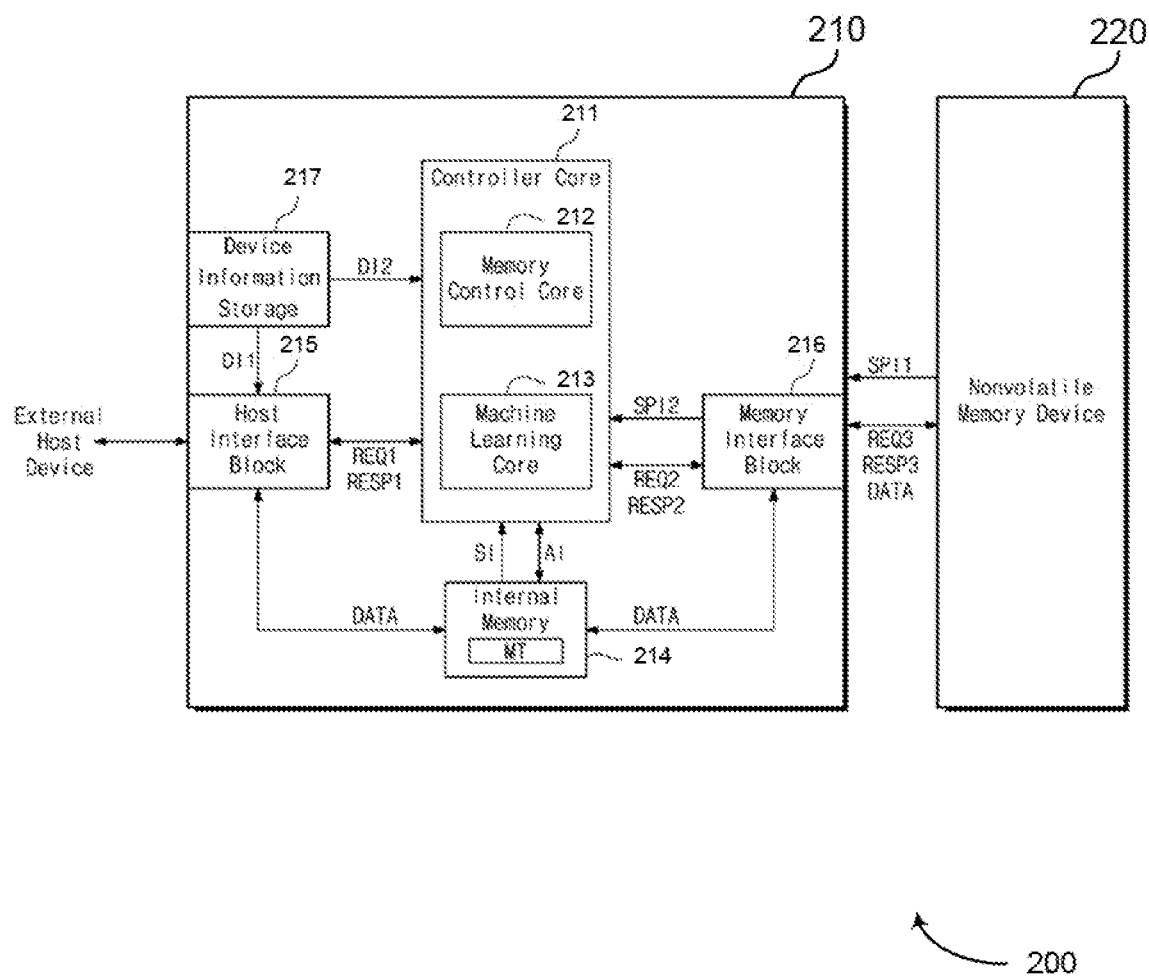
FIG. 2 is a block diagram illustrating the memory system of FIG. 1, according to an exemplary embodiment of the inventive concept.

FIG. 2 is a block diagram illustrating the memory system 200 of FIG. 1, according to an exemplary embodiment of the inventive concept.

Referring to FIG. 2, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 211, an internal memory 214, a host interface block 215, and a memory interface block 216. The memory controller 210 may also include a device information storage 217 configured provide first device information DI1 to the host interface block 215 and second device information DI2 to the controller core 211.

The controller core 211 may include a memory control core 212 and a machine learning core 213, and each of these cores may be implemented by one or more processors. The memory control core 212 may control and access the memory device 220 depending on a request received from the host 100 or an internally designated schedule. The memory control core 212 may manage and execute various metadata and codes used to manage or operate the memory system 200.

The machine learning core 213 may be used to perform training and inference of a neural network that is designed to perform noise cancellation on the memory device 220, as described in further detail below.

The internal memory 214 may be used, for example, as a system memory which is used by the controller core 211, a cache memory which stores data of the memory device 220, or a buffer memory which temporarily stores data between the host 100 and the memory device 220. The internal memory 214 may store a mapping table MT that indicates a relationship between logical addresses assigned to the memory system 200 and physical addresses of the memory device 220. The internal memory 214 may include, for example, a DRAM or an SRAM.

In an exemplary embodiment, a neural network such as the neural network described with reference to FIG. 9, may be included in a computer program which is stored in the internal memory 214 of the memory controller 210 or in the memory device 220. The computer program including the neural network may be executed by the machine learning core 213 to denoise data stored in the memory device 220. Thus, according to exemplary embodiments, the memory system 200 may denoise the data stored in the memory device 220 during a normal read operation of the memory device 220. That is, after manufacture of the memory system 200 is complete, during normal operation of the memory system 200, and particularly, during a normal read operation of the memory system 200 in which data is read from the memory device 220, the data stored in the memory device 220 that is being read may be denoised using the neural network locally stored and executed in the memory system 200, and the denoised data may be read out from the memory device 220.

The host interface block 215 may include a component for communicating with the host 100 such as, for example, a physical block. The memory interface block 216 may include a component for communicating with the memory device 220 such as, for example, a physical block.

Below, an operation of the memory system 200 over time will be described. When power is supplied to the memory system 200, the memory system 200 may perform initialization with the host 100.

The host interface block 215 may provide the memory control core 212 with a first request REQ1 received from the host 100. The first request REQ1 may include a command (e.g., a read command or a write command) and a logical address. The memory control core 212 may translate the first request REQ1 to a second request REQ2 suitable for the memory device 220.

For example, the memory control core 212 may translate a format of the command. The memory control core 212 may obtain address information AI with reference to the mapping table MT stored in the internal memory 214. The memory control core 212 may translate a logical address to a physical address of the memory device 220 by using the address information AI. The memory control core 212 may provide the second request REQ2 suitable for the memory device 220 to the memory interface block 216.

The memory interface block 216 may register the second request REQ2 from the memory control core 212 at a queue. The memory interface block 216 may transmit a request that is first registered at the queue to the memory device 220 as a third request REQ3.

When the first request REQ1 is a write request, the host interface block 215 may write data received from the host 100 to the internal memory 214. When the third request REQ3 is a write request, the memory interface block 216 may transmit data stored in the internal memory 214 to the memory device 220.

When data is completely written, the memory device 220 may transmit a third response RESP3 to the memory interface block 216. In response to the third response RESP3, the memory interface block 216 may provide the memory control core 212 with a second response RESP2 indicating that the data is completely written.

After the data is stored in the internal memory 214 or after the second response RESP2 is received, the memory control core 212 may transmit a first response RESP1 indicating that the request is completed to the host 100 through the host interface block 215.

When the first request REQ1 is a read request, the read request may be transmitted to the memory device 220 through the second request REQ2 and the third request REQ3. The memory interface block 216 may store data received from the memory device 220 in the internal memory 214. When data is completely transmitted, the memory device 220 may transmit the third response RESP3 to the memory interface block 216.

As the third response RESP3 is received, the memory interface block 216 may provide the memory control core 212 with the second response RESP2 indicating that the data is completely stored. As the second response RESP2 is received, the memory control core 212 may transmit the first response RESP1 to the host 100 through the host interface block 215.

The host interface block 215 may transmit data stored in the internal memory 214 to the host 100. In an exemplary embodiment, in the case in which data corresponding to the first request REQ1 is stored in the internal memory 214, the transmission of the second request REQ2 and the third request REQ3 may be omitted.

The memory device 220 may also transmit first Serial Peripheral Interface information SPI1 to the memory interface block 216. The memory interface block 216 may transmit second Serial Peripheral Interface information SPI2 to the controller core 211.

Figure 3:
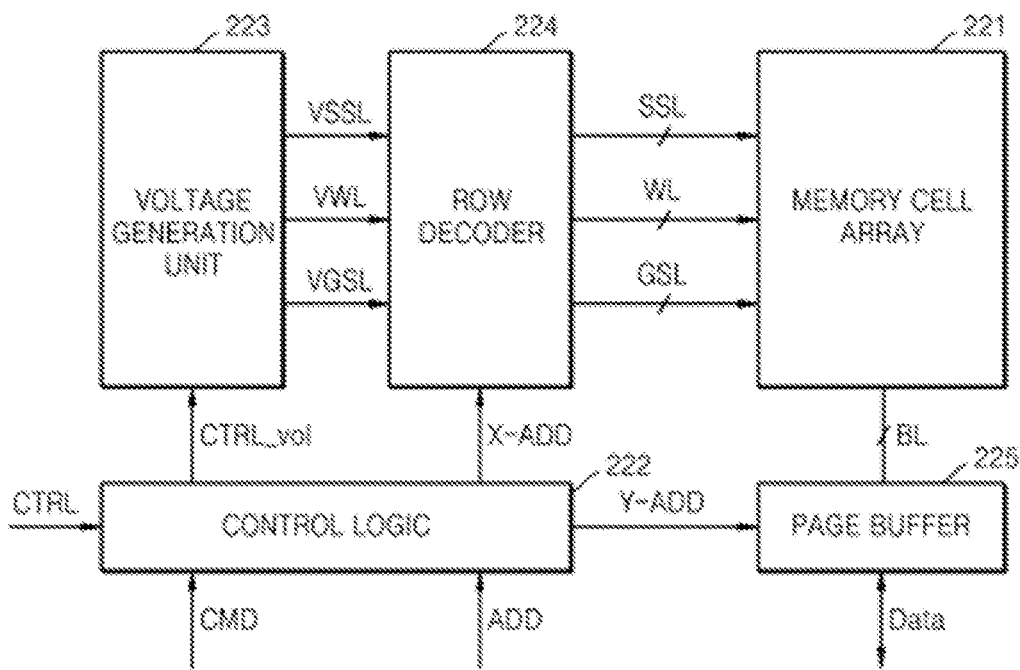
FIG. 3 is a detailed block diagram of a non-volatile memory device of FIG. 1, according to an exemplary embodiment of the inventive concept.

FIG. 3 is a detailed block diagram of the non-volatile memory device 220 of FIG. 1, according to an exemplary embodiment of the inventive concept. Referring to FIG. 3, the memory device 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an exemplary embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 5:
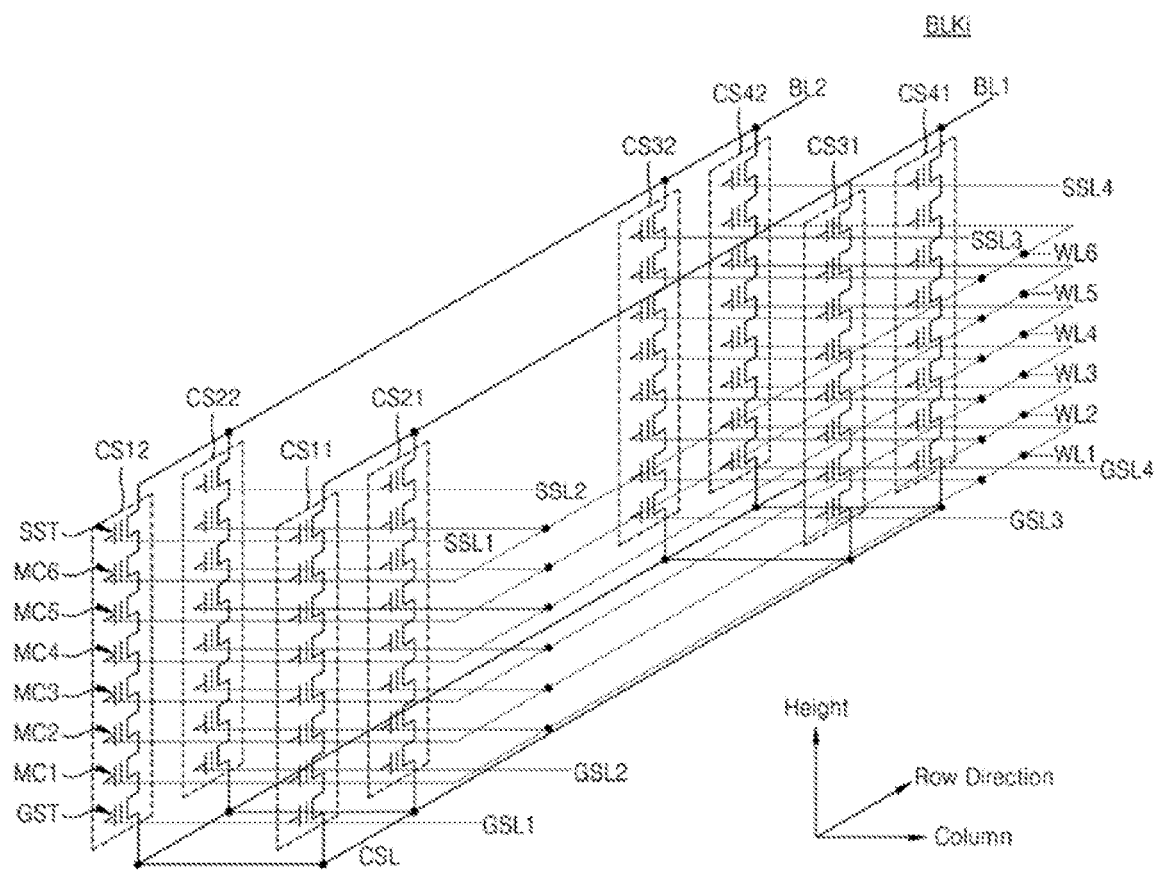
FIG. 5 is a circuit diagram of a memory block of the memory cell array of FIG. 4, according to an exemplary embodiment of the inventive concept.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an exemplary embodiment of the inventive concept.

Referring to FIG. 4, the memory cell array 221 according to an exemplary embodiment includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an exemplary embodiment of the inventive concept. FIG. 5 illustrates an example of one of the memory blocks BLK1 to BLKz in the memory cell array 221 of FIG. 4.

The memory block BLKi may include a plurality of cell strings CS11 to CS41 and CS12 to CS42. The plurality of cell strings CS11 to CS41 and CS12 to CS42 may be arranged in column and row directions to form columns and rows. Each of the cell strings CS11 to CS41 and CS12 to CS42 may include a ground select transistor GST, memory cells MC1 to MC6, and a string select transistor SST. The ground select transistor GST, the memory cells MC1 to MC6, and the string select transistor SST, which are included in each of the cell strings CS11 to CS41 and CS12 to CS42, may be stacked in a height direction substantially perpendicular to a substrate.

The columns of the plurality of cell strings CS11 to CS41 and CS12 to CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11 to CS41 and CS12 to CS42 may be connected to different bit lines BL1 and BL2, respectively. For example, the string select transistors SST of the cell strings CS11 to CS41 may be commonly connected to the bit line BL1. The string select transistors SST of the cell strings CS12 to CS42 may be commonly connected to the bit line BL2.

The columns of the plurality of cell strings CS11 to CS41 and CS12 to CS42 may be connected to different ground select lines GSL1 to GSL4, respectively. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The memory cells disposed at the same height from the substrate (or the ground select transistors GST) may be commonly connected to a single word line, and the memory cells disposed at different heights from the substrate may be connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6. The ground select transistors GST of the cell strings CS11 to CS41 and CS12 to CS42 may be commonly connected to the common source line CSL.

Memory Controller Architecture

Figure 6A:
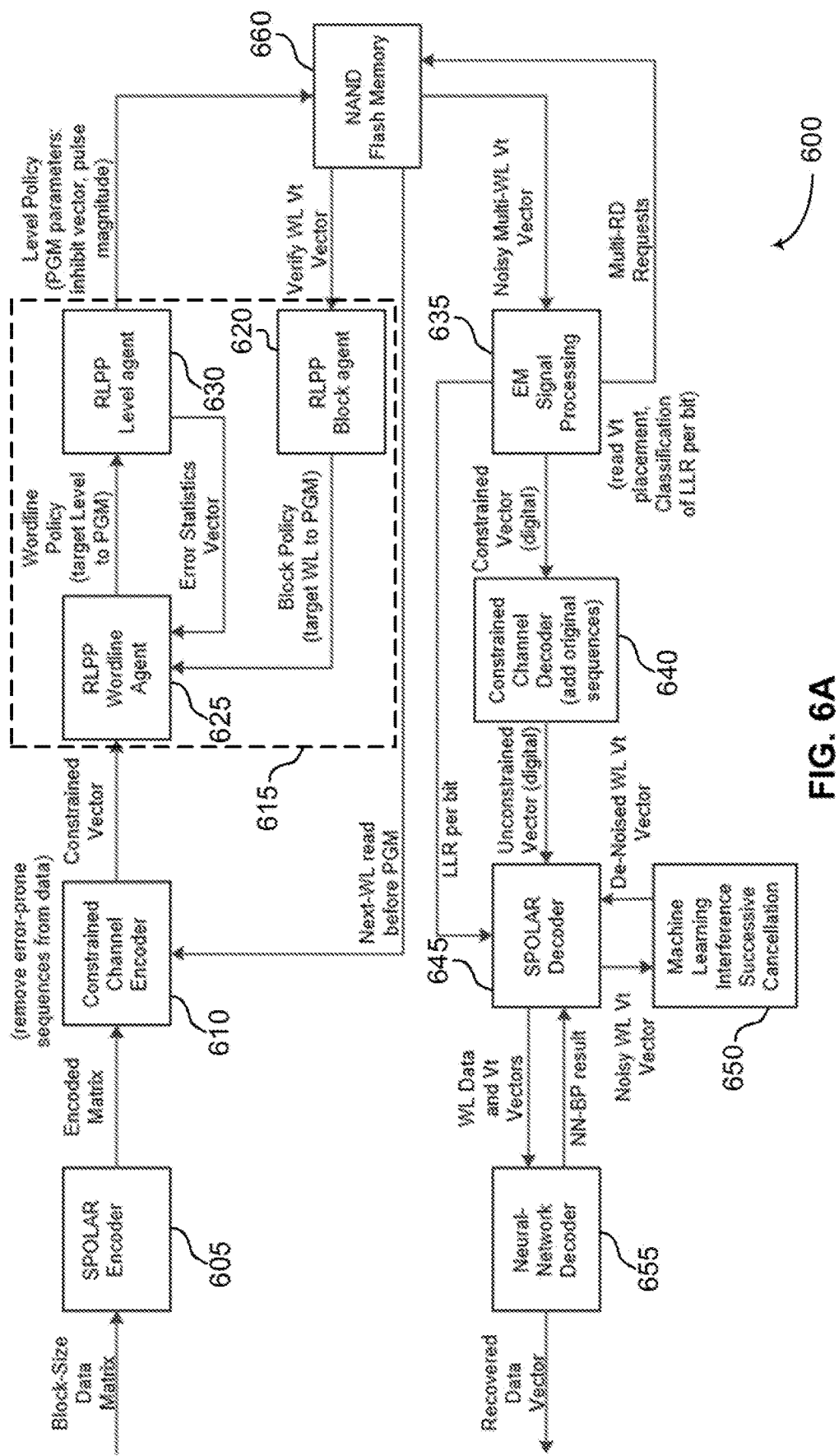
FIG. 6A shows an example of a memory controller according to aspects of the present disclosure.

FIG. 6A shows an example of a memory controller 600 according to aspects of the present disclosure. The example shown includes memory controller 600 and memory device 660. Memory controller 600 may receive a block of data, program the data to a memory device, and read the block of data from a memory device 660.

Memory controller 600 may be an example of the memory controller 210 described with reference to FIGS. 1-3. According to certain embodiments, memory controller 600 may include a processor and an internal memory and configured to operate the memory device 660. In some examples, the memory controller 600 includes a simplified memory controller 600 architecture configured for reduced power consumption suitable for use in a mobile architecture. In some examples, each cell of the memory device 660 is a 5-bit or 6-bit NAND flash memory cell.

Memory controller 600 may further include error correction code (ECC) encoder 605, constrained channel encoder 610, reinforcement learning pulse programming (RLPP) component 615, expectation maximization (EM) signal processing component 635, constrained channel decoder 640, ECC decoder 645, machine learning interference successive cancellation component 650, and neural network decoder 655.

ECC encoder 605 may be configured to encode data for programming to the memory device 660. ECC encoder 605 may receive a block-size data matrix as input and output an encoded matrix. In some examples, the ECC encoder 605 is configured to encode the data using an S-polar coding scheme that incorporates a Reed Solomon (RS) coding scheme and a polar coding scheme. In some examples, the ECC encoder 605 includes a reduced frame size and a reduced redundancy level configured for a mobile architecture. ECC encoder 605 may be an example of, or include aspects of, the corresponding element or elements described with reference to FIG. 10.

Constrained channel encoder 610 may be configured to encode an output of the ECC encoder 605 based on one or more constraints for programming to the memory device 660. In some examples, the constrained channel encoder 610 is configured to identify data from a next wordline of the memory device 660 prior to encoding the output of the ECC encoder 605 for a current wordline of the memory device 660. Constrained channel encoder 610 may receive an encoded matrix and a next-WL read (before programming) as input and output a constrained vector.

Constrained channel encoder 610 may encode the block of data based on a constrained coding scheme. Constrained channel encoder 610 may also identify data from a next wordline of the memory device 660, where the constrained coding scheme is based on the data from the next wordline.

Reinforcement learning pulse programming (RLPP) component 615 may be configured to identify a programming algorithm for programming the data to the memory device 660 and program the encoded block of data to a memory device 660 using RLPP. In some examples, RLPP component 615 may include block agent 620, wordline agent 625, and level agent 630.

Block agent 620 may receive a WL voltage vector as input and output a block policy (i.e., for a target WL to program). The wordline agent 625 may receive a constrained vector and the block policy and output a wordline policy (i.e., for a target level to program). The level agent 630 may receive the wordline policy and output a level policy (including programming parameters such as an inhibit vector and pulse magnitude). The level agent 630 may also provide an error statistics vector to the wordline agent 625.

The memory device 660 may receive the level policy and may store voltage levels to represent bits of information. During a read operation (after receiving one or more read requests such as multi-RD read requests), a noisy multi-wordline voltage vector may be provided to the EM signal processing component 635.

Expectation Maximization (EM) signal processing component 635 may be configured to receive a noisy multi-wordline voltage vector from the memory device 660 and classify each bit of the vector with a log likelihood ration (LLR) value. In some examples, the EM signal processing component 635 is configured to provide the LLR value to the ECC decoder 645. In some examples, the EM signal processing component 635 is configured based on a reduced sample size for a mobile architecture. EM signal processing component 635 may receive the noisy multi-wordline voltage vector and output a constrained vector, as well as LLR information for each bit.

Constrained channel decoder 640 may be configured to receive a constrained vector from the EM signal processing component 635 and produce an unconstrained vector. In some embodiments, constrained channel decoder 640 may decode a block of data based on a constrained coding scheme. The Constrained channel decoder 640 may receive a constrained vector and output an unconstrained vector.

ECC decoder 645 may be configured to decode data, including an unconstrained vector. For example, ECC decoder 645 may decode a block of data based on an ECC coding scheme. In some examples, the ECC coding scheme includes an S-polar coding scheme that incorporates an RS coding scheme and a polar coding scheme. In some examples, the decoding the block of data based on the ECC coding scheme is performed based on the LLR value. The ECC decoder may receive LLR information for each bit, as well as an unconstrained vector, and output WL data and voltage vectors. In some cases, the ECC decoder 645 receives a neural network decoder result. In some cases, the ECC decoder 645 sends the noisy wordline voltage vector to machine learning interference successive cancellation component 650 and receives a de-noised wordline voltage vector.

Machine learning interference successive cancellation component 650 may be configured to receive a noisy wordline vector from the ECC decoder 645 and provide a de-noised wordline vector to the ECC decoder 645. In some examples, the Machine learning interference successive cancellation component 650 may operate based on input from the EM signal processing component 635. However, in other embodiments, the EM signal processing component 635 may operate independently of the EM signal processing component 635.

In some cases, machine learning interference successive cancellation component 650 may determine that the decoding based on the ECC coding scheme is not sufficient. Machine learning interference successive cancellation component 650 may also perform machine learning interference successive cancellation based on a determination that the ECC decoder has not properly decoded a block of data. In some examples, machine-learning processing for NAND cells may be based on a coupling effect cancellation inside the EM.

Neural network decoder 655 may receive a wordline data vector and a wordline voltage vector and produce a recovered data vector. In some examples, the neural network decoder 655 includes a reduced number of nodes, where the reduced number of nodes is selected for a mobile architecture. In some cases, the neural network decoder 655 sends a result to the ECC decoder 645. Ultimately, the neural network decoder 655 outputs a recovered data vector.

In some cases, neural network decoder 655 may determine that the decoding based on the ECC coding scheme is not sufficient. Neural network decoder 655 may also decode the block of data using a neural network decoder 655. Neural network decoder 655 may be an example of, or include aspects of, the corresponding element or elements described with reference to FIG. 10.

Figure 6B:
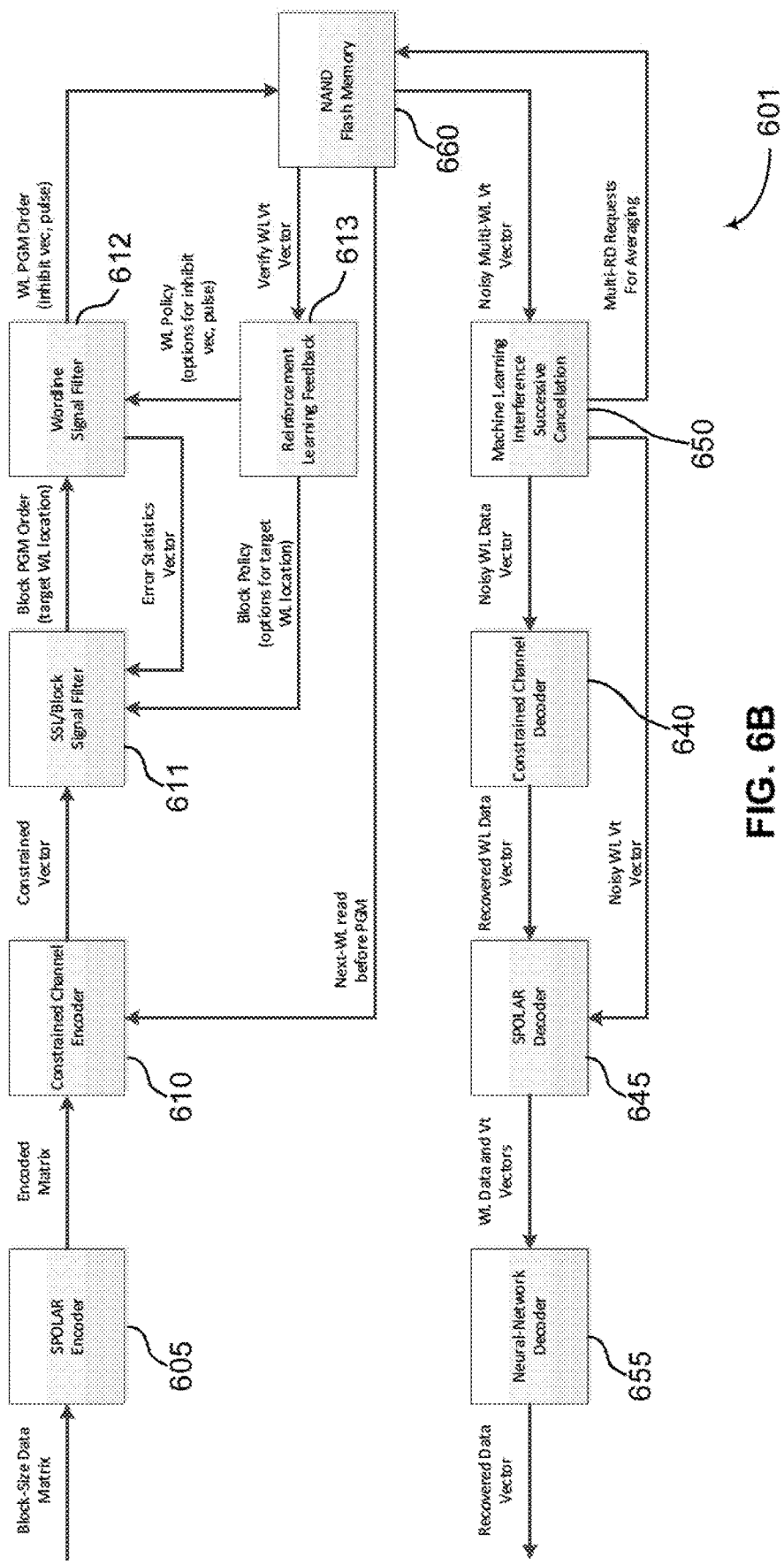
FIG. 6B shows another example of a memory controller according to aspects of the present disclosure.

FIG. 6B shows another example of a memory controller according to aspects of the present disclosure. The example shown includes memory controller 601 and memory device 660. Memory controller 601 may receive a block of data, program the data to a memory device, and read the block of data from a memory device 660. The subcomponents of memory controller 601 may be similar to those of memory controller 600 described above with reference to FIG. 6A with the differences described below. Both FIGS. 6A and 6B are shown as examples, and embodiments of the present disclosure are not limited thereto.

Specifically, according to FIG. 6B, memory controller 601 may include a reinforcement learning feedback component 613, which may correspond to the reinforcement learning pulse programming (RLPP) component 615, but which provides feedback to a block signal filter component 611. The block signal filter component 611 may provide a block programming order to a wordline signal filter 612, which may provide a wordline program order for programming to the memory 660.

Additionally or alternatively, the machine learning interference successive cancellation component 650 may receive the noisy multi-wordline voltage vector directly from the memory 660, and provide a noisy wordline data vector to the constrained channel coder 640.

Error Correction Coding

Figure 7:
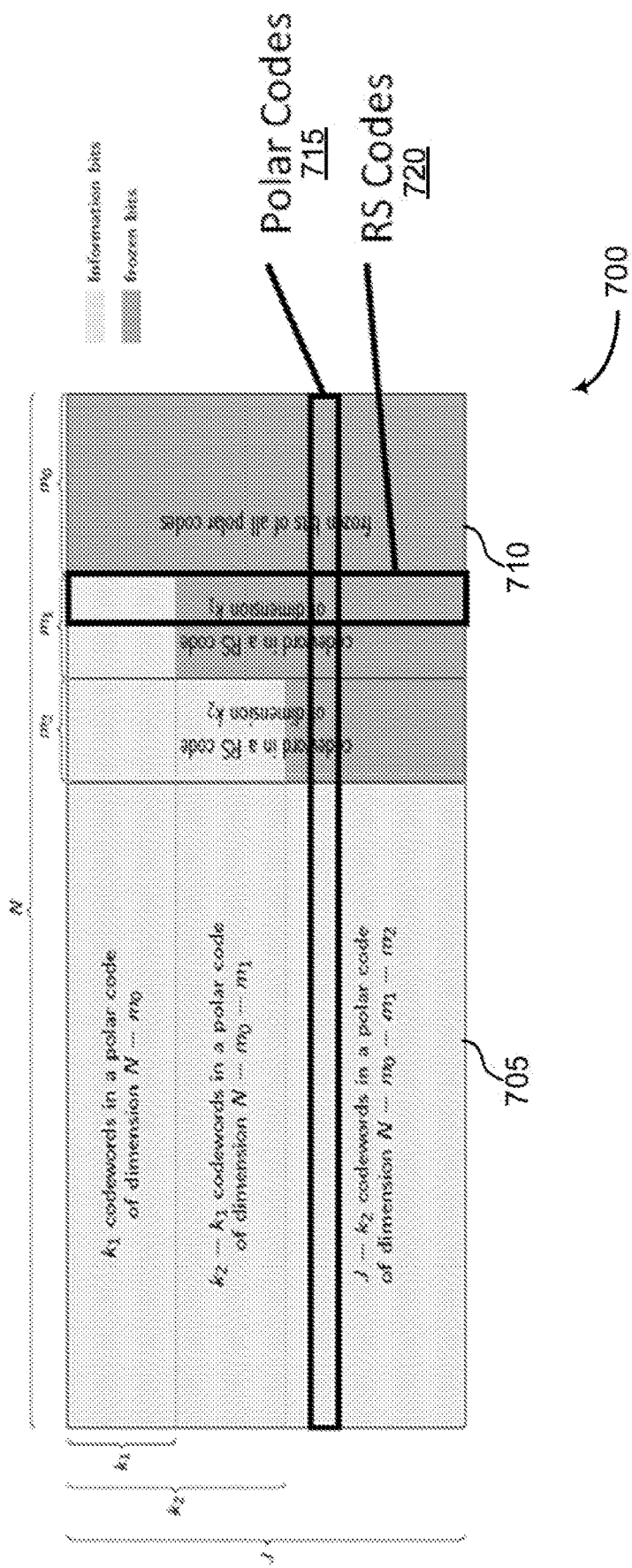
FIG. 7 shows an example of an error correction code (ECC) coding scheme according to aspects of the present disclosure.

FIG. 7 shows an example of an ECC encoding scheme according to aspects of the present disclosure. An S-Polar coding scheme may be used to encode data for programming to a memory device. The S-Polar coding scheme may incorporate aspects of Reed Solomon (RS) coding scheme and a polar coding scheme. Specifically, a data block 700 is shown which includes information bits 705, frozen bits 710 (e.g., based on the polar coding scheme), polar codewords 715, and RS codewords 720.

Error correction coding (ECC) and decoding operations may be performed on a data stream to correct communication errors such as interference or noise. A polar code is a linear block error correcting code based on a multiple recursive concatenation of a short kernel code which transforms the physical channel into multiple virtual outer channels. The virtual channels tend to either have high reliability or low reliability (i.e., they polarize). Data bits are allocated to the most reliable channels, and unreliable channels are "frozen" or set to 0.

RS codes also operate on a block of data, which is treated as a set of finite field elements called symbols. An RS encoding scheme involves adding check symbols to the data. Using the check symbols, an RS code can detect erroneous symbols.

An S-Polar code is based on a polar code and RS code concatenation. Features of the S-Polar code include high performance and easy scalability with overheads and code sizing. S-Polar codes may use a multi-stage encoding process. Multiple RS codes may be encoded in parallel, symbol by symbol.

FIG. 7 illustrates and embodiments in which a block of data having dimension N×J may include $k_1$ polar codewords 715 of dimension N−$m_0$, $k_2$−$k_1$ polar codewords 715 of dimension of N−$m_0$−$m_1$, and J−$k_2$ polar codewords 715 of dimension N−$m_0$−$m_1$−$m_2$. Accordingly, the S-Polar code may include N−$m_0$−$m_1$ RS codewords 720 of dimension J, $m_2$ RS codewords 720 of dimension $k_2$, and $m_0$ RS codewords 720 of dimension $k_1$.

Constrained Coding

In addition to the ECC encoding, a constrained coding scheme may also be applied. Constrained coding represents a programming task as set of parameters and constraints. First, a user inputs a set of variables, defining a problem, where all variables have a set of possible values. Then, constraints are applied. For example, certain values may be determined to be usable or unusable. A solution is then output. Next, either a decision making operation and a constraint propagation operation is performed. New constraints are determined by the decision making operation. Additionally, contradictions are determined by the constraint propagation operation and a new set of constraints are defined and then solved until the desired output is calculated.

Thus, a constrained coding scheme may set a constraint that restricts the usage of certain bit patterns that are more likely to cause interference when reading data from the memory device. The constraints may be applied to bits in a wordline, and may also be applied across wordlines.

According to the present disclosure, constrained coding may be to mitigate inter-pillar. Inter-pillar interference refers to the interference between neighboring cell pillars. That is, high voltage levels may generate interference on lower level pillars. In one example, the first 8 lowest levels are interfered levels and a last 8 high levels are interfering levels. On average, there are 4 layers of interfered levels and 4 layers of interfering levels. In one embodiment, constrained coding reduces the number of high and low level pillars subject to interference, providing a deterministic process where each pillar has 2 interfered and 2 interfering levels.

Reinforcement Learning Pulse Programming

Figure 8:
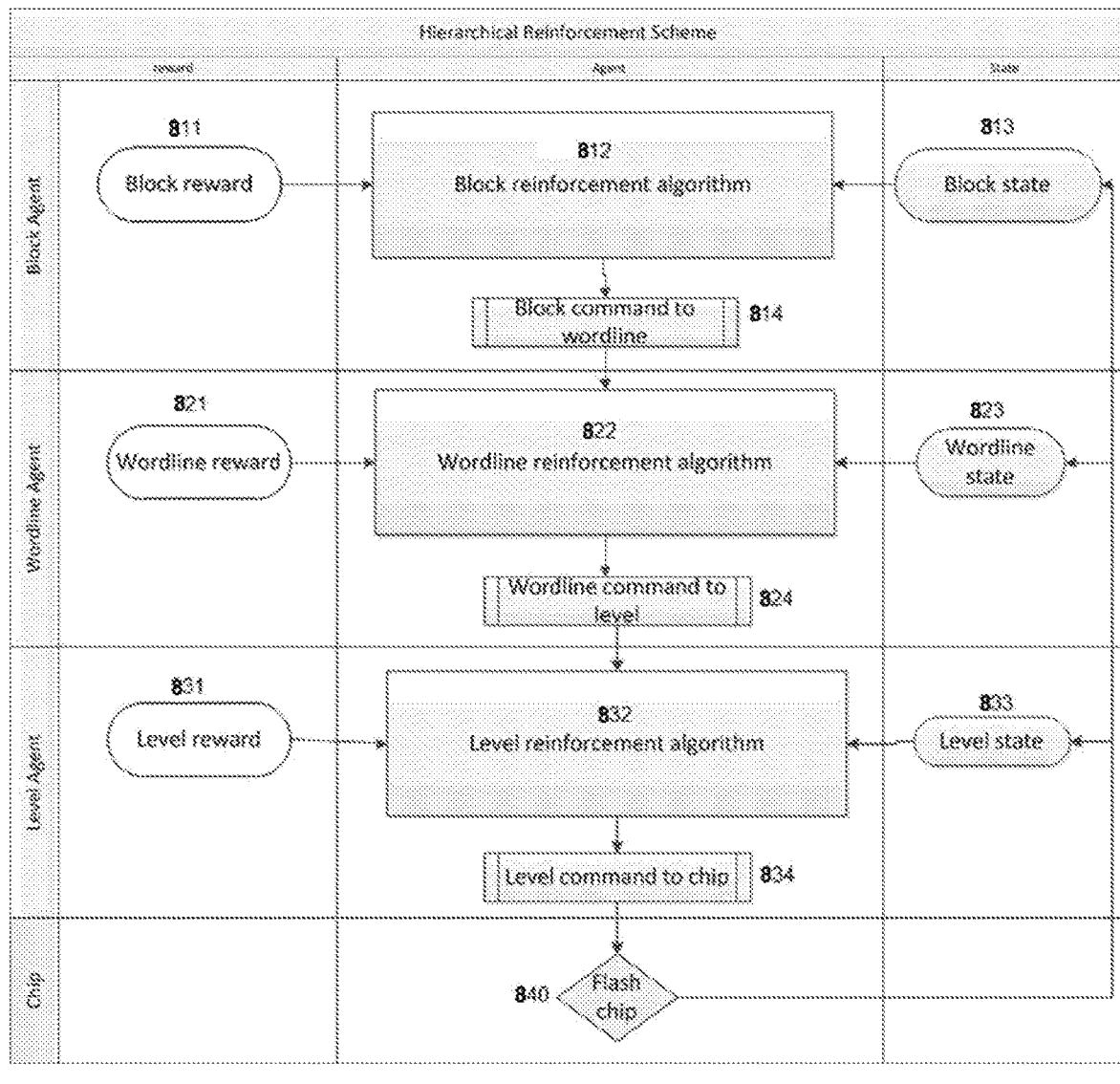
FIG. 8 illustrates a hierarchical reinforcement learning scheme according to an embodiment of the disclosure.

FIG. 8 illustrates a basic hierarchical reinforcement learning scheme, according to an embodiment of the disclosure.

Programming a NAND Flash device can be described by the following process. First, each cell in a wordline WL has a voltage $v_{cell}$, and $\overline{v_{cell}}$ is a vector of all voltages in WL. After an erase operation, $\overline{v_{cell}} = \overline{v_{start}}$. Then, each cell has a target voltage $v_{target}$, and $\overline{v_{target}}$ is a vector of all target voltages in WL. The vector $\overline{v_{cell}}$ may also be referred to as the WL state.

A program agent can then apply a series of pulses to WL that change the state $\overline{v_{cell}}$. The agent's goal is to change the $\overline{v_{cell}}$ to be as close to $\overline{v_{target}}$ as possible. After each pulse, $\overline{v_{cell,new}} = \overline{v_{cell,old}} + \Delta\overline{v_{cell}}$. In some cases $\Delta\overline{v_{cell}}$ depends on the pulse parameters selected by the agent: (1) pulse power; and (2) inhibit vector. A pulse with selected parameters is referred to as an action. The new WL state depends only on the old WL state and that last action taken. This type of process is known as a Markov Decision Process (MDP).

Thus, according to certain embodiments, NAND flash memories have a three-level hierarchy of block, wordline, and cell. The number of blocks varies between chip types but is usually in the order of several thousand per chip. A flash memory device can then consist of one or more such chips, so overall the number of blocks per flash memory device varies quite a bit. The number of wordlines per block varies as well. Different chip types can have 64, 128 or 256 wordlines, and this may change in the future. A cell is a physical part of the wordline, i.e. a wordline is basically a long string of cells.

A level is a conceptual entity, in that each cell is programmed to have a certain voltage level. Cells are then grouped according to their voltage levels into N groups, in which case there are N levels in the wordline. The cell voltage determines which level the cell belongs to, and accordingly what information the cell encodes. Every cell at the same level stores the same information. The number of levels per wordline varies, according to the writing scheme. The number of levels is 2 to the power of the number of bits per cell that are written. For example, for 3 bits per cell, there would be 8 levels per wordline, but this may also vary, even in the same block, according to how many bits per cell are written on in a specific wordline.

Hierarchical reinforcement learning (HRL) is a framework for combining learning on different scales. According to embodiments of the disclosure, there are three different agents acting on three different scales, block, wordline and cell scales, all combined under the HRL framework. A single action of a higher level agent is an entire episode of a lower level agent, i.e. the action of the higher level agent defines the parameters under which the lower level agent executes a series of lower level actions, which together comprise the entire episode. However, each agent in the hierarchy has a decision model to allow the agent to choose an action. These models are policy networks. An exemplary policy network is an actor-critic model.

The inhibit vector marks all the cells that need to be programmed with zeros and those that should not be programmed, with ones. The inhibit vector can be very large (around 147 K cells) so a policy network cannot output the cell as a decision, i.e. individually decide for each cell in the vector whether each cell should be one or zero. So instead, embodiments of the disclosure use a different solution. Methods according to embodiments output a voltage threshold, and place ones in the inhibit vector for all cells whose voltage exceeds the chosen threshold. The remaining cells are left as zeros. This way, a network according to an embodiment only has to output one number, instead of 147 K numbers, aside from the networks power output, which is also a single number, and which is separate from the inhibit vector.

Embodiments of the disclosure seek to train an agent to program different voltage levels to different cells. However, since the state-action space is too large for brute-force reinforcement learning, embodiments of the disclosure exploit the hierarchical structure of a NAND flash and decompose the task into several subtasks on different levels. This way a group of smaller subtasks can be integrated, and learning becomes feasible.

Embodiments of an RLPP component may include three distinct agents. A level rank agent may Efficiently write each voltage level of the word-line, minimizing the distance to the target level. After the voltage level has been written, control passes to the wordline agent. A wordline rank agent determines which voltage levels to program for a given wordline, and directs the lower rank agent to program those levels, while minimizing interference between different levels on the same word-line. The number of possible levels is $2n$, where n is the number of bits per cell. After the whole wordline has been written control passes to the block agent. A block rank agent determines which wordline in a block to program, while minimizing interference between word-lines on the same block. After all wordlines have been written, the NAND programming terminates.

Referring again to FIG. 8, a method according to an embodiment may start with the block agent, which programs the entire block. The block agent is the "Block reinforcement algorithm" 812 and gets a "Block state" 813 input from the chip, and decides on an action, such as which wordline in the block to currently program. This action translates into a set of parameters that are passed as "Block command" 814 to the wordline agent, under which the wordline agent begins to operate. The wordline agent is the "Wordline reinforcement algorithm" 822 which receives the Block command 814 and gets a "Wordline state" 823 from the chip and decides on an action itself, and passes the action as the "Wordline command" 824 down to the level agent. The level agent is the "Level reinforcement algorithm" 832 and receives the Wordline command 824 and gets a 'Level state' 833 from the chip, and decides on an action. This action translates into a Level command 834 to a flash chip 840. The Level command 834 then programs the flash chip 840 according to an action until done, and then returns control to the wordline agent indicating that the level agent's action is complete. After the wordline agent is done as well, the wordline agent returns control to the block agent, indicating that the wordline agent's action are complete. The block algorithm, wordline algorithm and level algorithm parameter rewards 811, 821, and 831, respectively, in the leftmost column are used during agent training. Then, in addition to executing decisions, each training agent also uses the rewards to update itself and improve.

According to embodiments, a reinforcement learning model can be based on existing algorithms or on human expertise. For example, a reinforcement learning model according to an embodiment can learn from the existing algorithm or expert by imitation. The reinforcement learning model can then be improved on the wordline level, and after finding a basic stable policy, the reinforcement learning model can then be adapted to program a block.

Expectation Maximization

In some cases, cells with 5 or 6 bits per cell (BPC) may have relatively dense voltage levels (e.g., 156 mv for 5 bpc or 105 mv for 6 bpc). This may result in additional errors when reading the voltage level of a cell. That is, additional accuracy may be required, and the reading may be more sensitive to interference. Thus, an EM signal processing component may be configured to receive a noisy multi-wordline voltage vector from the memory device and classify each bit of the vector with an LLR value.

A maximum likelihood estimation (MLE) algorithm may be used to estimate parameters in a statistical model of the memory device, where the model depends on unobserved latent variables. Given a set of data samples, x, a model, $p_\theta(x, z)$, may estimate the value of the sample given some unobserved data or missing values. The MLE algorithm may optimize one or more parameters $\theta = \mathrm{argmax}_\theta p_\theta(x)$.

In some examples, the EM algorithm seeks to find the MLE of the marginal likelihood by iteratively applying two steps until convergence. First an expectation step may be represented by $Q(\theta|\theta^{(t)}) = E_{z|x,\theta^{(t)}}[\mathrm{Log}(p_\theta(x, z)) = \Sigma_z p(z|x, \theta^{(t)}) \mathrm{Log}(p_\theta(x, z))$. Second, a maximization step may find the parameters $\theta$ that maximize the quantity given by $\theta^{(t)} = \mathrm{argmax}_\theta Q(\theta|\theta^{(t)})$. In some examples, this is not guaranteed to provide a global maximum.

In some cases, an EM algorithm may utilize a gaussian mixture by taking samples from a set of normal distributions. The number of cells per level may be known in advance. In some cases, shaping is supported. Cell counting may give a course estimation for level means used in initialization. Well-initialized sessions may result in fewer iterations.

In some cases, a noisy erase level may not be regarded as Gaussian, which results in a sub-optimal Gaussian estimation. Thus, a noisy erase level may be estimated using a Johnson-SU distribution. The estimation may be removed from the histogram to continue with the EM.

In some cases, the output from the EM process may be used to improve a subsequent interference cancellation process (e.g., as described below with reference to FIG. 9). For example, the machine-learning processing for interference cancellation for the NAND memory cells may have a coupling effect with the EM to further improve read reliability.

Noise Cancellation

Figure 9:
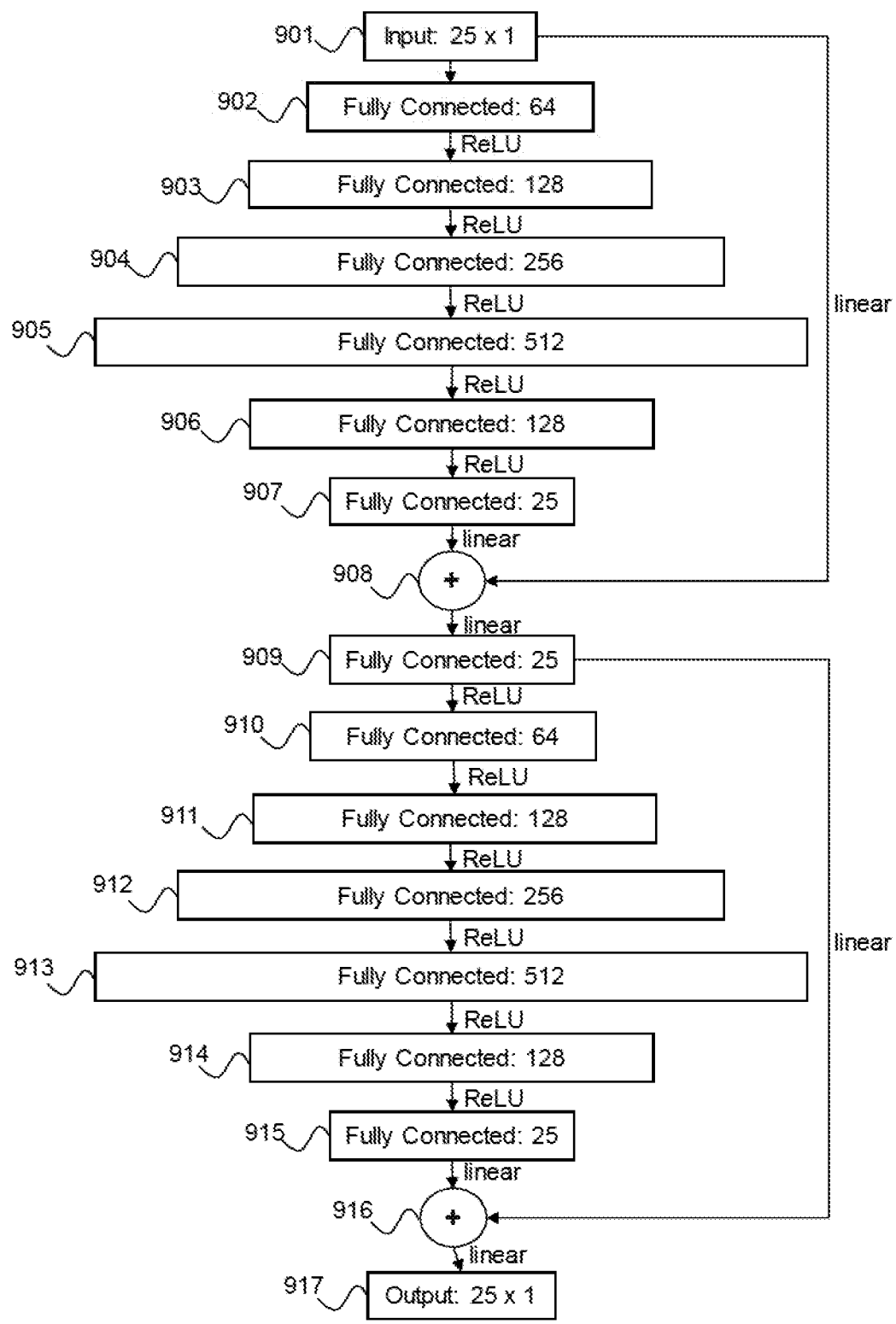
FIG. 9 is a diagram illustrating the structure of a neural network for noise cancellation according to aspects of the present disclosure.

FIG. 9 is a diagram illustrating the structure of a neural network for noise cancellation according to aspects of the present disclosure. When storing multiple number of bits in a single memory cell, program noise may cause errors with the stored data. For example, in a VNAND memory device, when one word line is being programmed (written to), this programming may cause noise to occur on neighbouring word lines, which may cause errors later when those word lines are read. A particularly strong noise may be generated by memory cells located geometrically one above another (e.g., memory cells located in the same pillar or column).

According to certain embodiments, a noise cancellation component may extract a voltage level from each memory cell connected to a string select line (SSL), provide the voltage levels of the memory cells as input to a neural network, and perform noise cancellation on the SSL, by changing voltage levels of the memory cells from a first voltage level to a second voltage level.

Noise cancellation may be performed based on deep learning using a database. Deep learning is a sub-concept of machine learning, and is a type of neural network model of machine learning which relates to artificial intelligence. Various neural network architectures may be used for deep learning. For example, an artificial neural network (ANN), a deep neural network (DNN), a convolutional neural network (CNN), a recurrent neural network (RNN), and a generative adversarial network (GAN) may be used for deep learning. However, network architectures that may be used for deep learning are not limited thereto.

In exemplary embodiments, noise cancellation performed is performed using a ResNet having several identical consecutive residual blocks. An example of such a ResNet is shown in FIG. 9. This configuration allows for an iterative noise cancellation process to be performed, in which only the noise is learned (e.g., in which only the difference between the clean data and the noised data is learned). For example, the ResNet may learn to successively denoise the data, learning only the noise delta of each iteration.

The input for the ResNet may be a single noised SSL, e.g., one of SSL1, SSL2, SSL3 and SSL4, and the output may be the denoised string select line SSL. Since exemplary embodiments utilize a single SSL each time when performing noise cancellation, only the loss in voltages (the distance between the noised cell voltage and the clean cell voltage) is measured in exemplary embodiments. However, since raw bit error rate (BER) is a non-monotonic measure relative to voltage distance, measuring only the loss in voltage allows for the raw BER to be reduced or minimized.

In FIG. 9, the number in each input layer 901-907, 909-915 and 917 indicates the number of neurons in that layer. The indication "x1" in the input layer 901 and the output layer 917 indicates the shape of these layers. For example, each of the input layer 901 and the output layer 917 includes 25 neurons shaped as a vector of 25. The width of the input layer is equal to the number of word lines WL connected to a single string select line SSL (e.g., the number of word lines WL in the memory block divided by 4) (e.g., 25 in a 6 BPC scheme as illustrated in FIG. 6). The input layer 901 corresponds to the noised SSL fed into the neural network for denoising.

The type of each layer in the neural network is a fully connected layer. That is, each neuron in each layer connects to each neuron in the next layer. The connections between these neurons have corresponding weights, which are learned during training. When each layer is filled by some input from the previous layer, the layer multiplies the input by some weight, and then performs a non-linear operation (e.g., a Rectified Linear Unit (ReLU) function) before sending the results as input for the next layer.

The arrows between layers indicate the type of activation function used for the neurons in that layer. In exemplary embodiments, a Rectified Linear Unit (ReLU) function, which is a non-linear function, is used as the activation function between layers 902 and 903, 903 and 904, 904 and 905, 905 and 906, 906 and 907, 909 and 910, 910 and 911, 911 and 912, 912 and 913, 913 and 914, and 914 and 915. The ReLU activation function determines whether a neuron should be activated by calculating a weighted sum of the neurons input and adding a bias, thus, introducing non-linearity into the output of the neuron. A linear function is used as the activation function between input layer 901 and operation 908, layer 907 and operation 908, operation 908 and layer 909, layer 909 and operation 916, layer 915 and operation 916, and operation 916 and output layer 917. That is, between these layers and operations, no non-linear activation function is performed.

Operation 908 sums the output of layer 907 with the input layer 901, and feeds this output to layer 909. Operation 916 sums the output of layer 915 with layer 909, and feeds this output to the output layer 917. The output layer 917 outputs the denoised SSL.

The denoised SSL output by the output layer 917 may be used when data is output from the memory device (e.g., read from the memory device). For example, referring to FIG. 6, assume that data stored in a memory cell connected to SSL3 (e.g., one of memory cells of word lines WL3, WL7, . . . WL99) is being read out from the memory device. The data may be read out from the memory device, for example, when accessed by a user, when being passed to a subsequent stage of data processing, etc. When the data is read out from the memory device, the operations described above with reference to FIG. 7 may be performed to denoise the data (e.g., to correct the data) before the data is read out from the memory device.

For example, when data is requested to be read from one of memory cells of word lines WL3, WL7, . . . WL99, SSL3 is first denoised by the neural network by changing the voltage level of at least one of the memory cells of word lines WL3, WL7, . . . WL99 from a first voltage level to a second voltage level, in which the first voltage level is classified as belonging to a first cluster (of 64 clusters in a 6 BPC scheme) and the second voltage level is classified as belonging to a second cluster (of 64 clusters in a 6 BPC scheme).

It is to be noted that the voltage levels of such memory cell are not actually changed within the memory device at this time, since writing to the memory cells would re-introduce the noise for the same reasons described above.

Rather, the changed (corrected) voltage levels of such memory cells output by the neural network are output by the memory device at the time that data from such memory cells is read out from the memory device, instead of the actual voltage levels of such memory cells within the memory device being read out at this time. That is, the cleaner, denoised version of the data generated by the neural network is output by the memory device, while the noised version of the data actually stored in the memory device is untouched and remains the same within the memory device. Thus, this process may be performed again each time this data is read out from the memory device.

A level skip operation may be performed when reading out data from the memory device such that voltage levels that have been made worse by noise cancellation are not changed when read out from the memory device (e.g., the actual, unchanged voltage levels in the memory device may be read out for these memory cells). The cleaner, denoised version of the data (as well as any data intentionally left unchanged according to the level skip operation) may be translated into digital form before being read out from the memory device.

Since BER may be determined by the Grey Code mapping of levels to bits, in some cases, reducing voltage error can potentially increase the number of wrong bits per cell. Accordingly, exemplary embodiments may approximate the BER loss on the range at which the BER loss is still monotone and has a constant loss otherwise.

Neural Network Decoder

Figure 10:
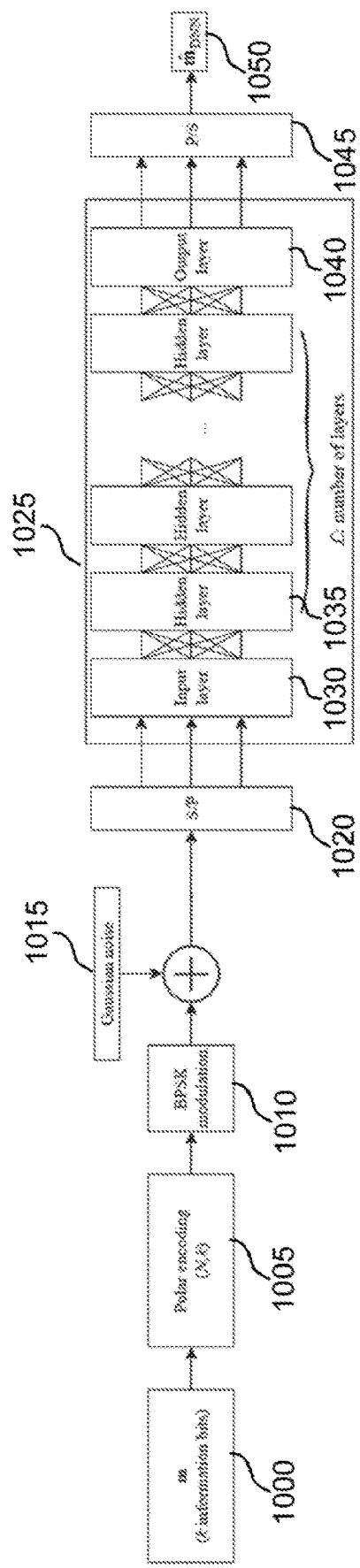
FIG. 10 shows an example of a neural network decoder according to aspects of the present disclosure.

FIG. 10 shows an example of a neural network decoder 1025 according to aspects of the present disclosure. The example shown includes information bits 1000, ECC encoder 1005, modulation 1010, noise source 1015, signal processing 1020, neural network decoder 1025, output processing 1045, and output information bits 1050.

Information bits 1000 may be encoded by ECC encoder 1005 (e.g., using a polar coding scheme or an S-Polar encoding scheme). In some cases a modulation scheme such as binary phase-shift keying (BPSK) may be applied by modulation 1010 prior to transmitting or programming the data. Upon receiving (or reading) the data, the data may include noise from noise source 1015. The neural network decoder 1025 may be used to decode the data in the presence of noise from the noise source 1015.

ECC encoder 1005 and neural network decoder 1025 may be an example of, or include aspects of, the corresponding elements described with reference to FIG. 6. Neural network decoder 1025 may include input layer 1030, hidden layer 1035, and output layer 1040.

Neural network decoder 1025 may operate using weighted Belief Propagation (WBP) based on a message-passing algorithm. The believe propagation may be a calculated marginal distribution for an unobserved variable based on observed variables. A neural network learns optimal weights of each message. The parameters of the neural network decoder 1025 may be updated based on a loss function, such as a loss function based on cross-entropy of a decoded codeword and an original codeword.

According to one embodiment, a feed-forward artificial neural network (ANN) is used as the neural network decoder 1025. An ANN is a hardware or a software component that includes a number of connected nodes (a.k.a., artificial neurons), which may loosely correspond to the neurons in a human brain. Each connection, or edge, may transmit a signal from one node to another (like the physical synapses in a brain). When a node receives a signal, the node can process the signal and then transmit the processed signal to other connected nodes. In some cases, the signals between nodes comprise real numbers, and the output of each node may be computed by a function of the sum of each nodes input. Each node and edge may be associated with one or more node weights that determine how the signal is processed and transmitted.

During the training process, these weights may be adjusted to improve the accuracy of the result (i.e., by minimizing a loss function which corresponds in some way to the difference between the current result and the target result). The weight of an edge may increase or decrease the strength of the signal transmitted between nodes. In some cases, nodes may have a threshold below which a signal is not transmitted at all. The nodes may also be aggregated into layers. Different layers may perform different transformations on their inputs. The initial layer may be known as the input layer and the last layer may be known as the output layer. In some cases, signals may traverse certain layers multiple times.

According to one example, the loss function of the neural network may be the cross-entropy of the decoded codeword u and the original codeword o. Structured codes (such as polar codes) may be used to increase the generalization property.

Exemplary Methods

Figure 11:
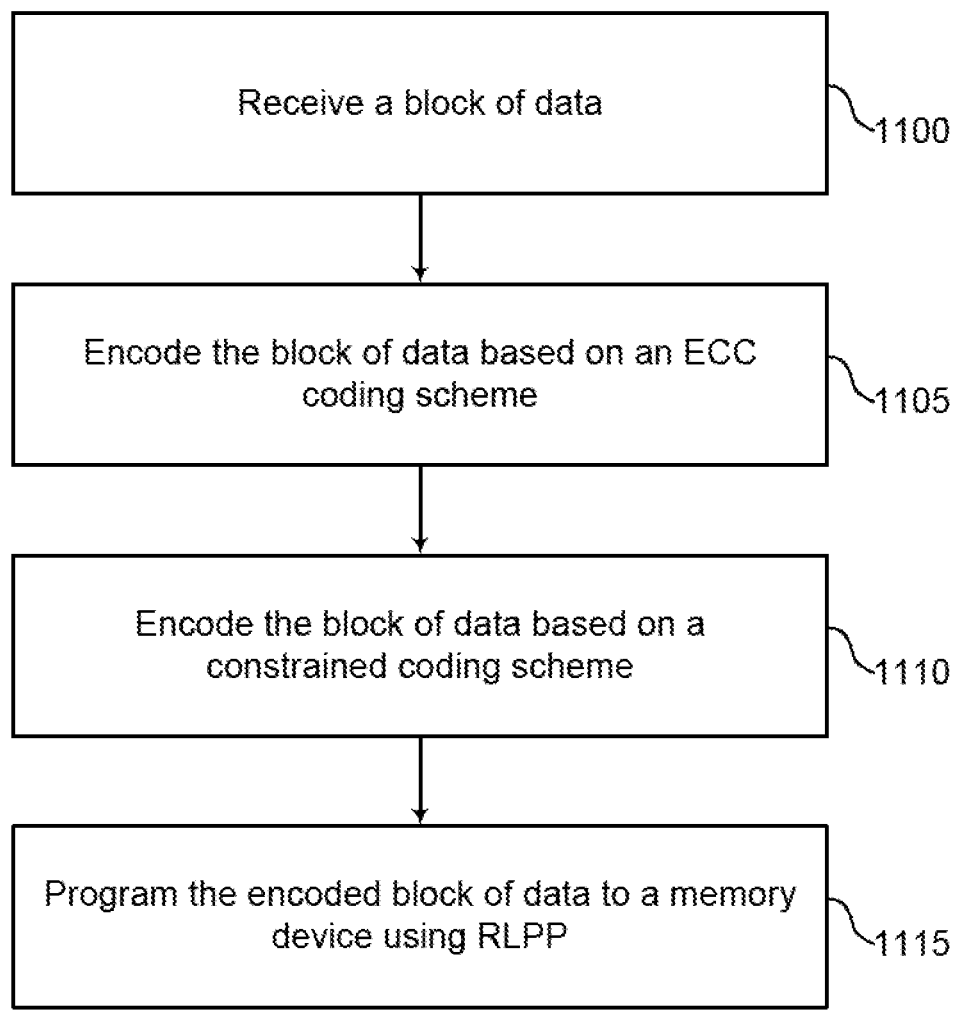
FIG. 11 shows an example of a process for programming data to a memory device according to aspects of the present disclosure.

FIG. 11 shows an example of a process for programming data to a memory device according to aspects of the present disclosure. In some examples, these operations may be performed by a system including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At operation 1100, the system receives a block of data. In some cases, the operations of this step may refer to, or be performed by, a memory controller as described with reference to FIG. 6.

At operation 1105, the system encodes the block of data based on an ECC coding scheme. In some cases, the operations of this step may refer to, or be performed by, an ECC encoder as described with reference to FIGS. 6 and 10.

At operation 1110, the system encodes the block of data based on a constrained coding scheme. In some cases, the operations of this step may refer to, or be performed by, a constrained channel encoder as described with reference to FIG. 6.

At operation 1115, the system programs the encoded block of data to a memory device using RLPP. In some cases, the operations of this step may refer to, or be performed by, a RLPP component as described with reference to FIG. 6.

Figure 12:
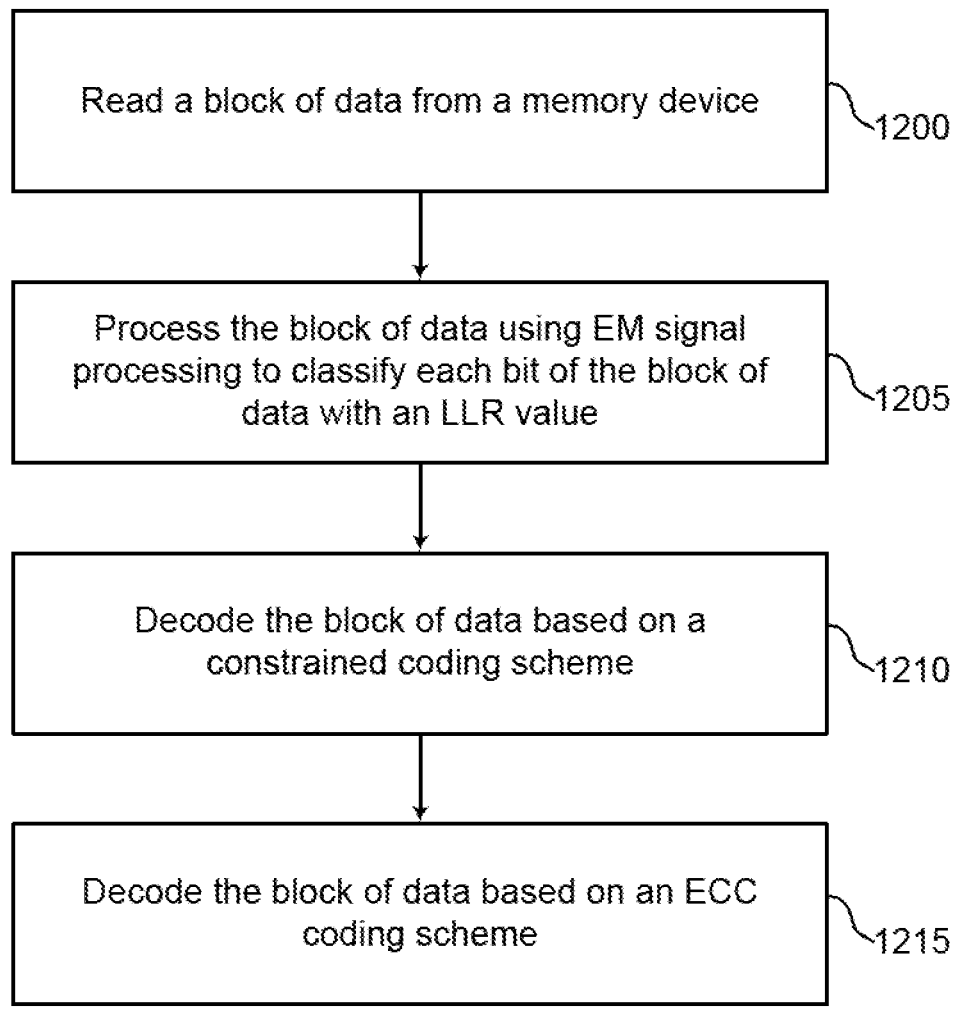
FIG. 12 shows an example of a process for reading data from a memory device according to aspects of the present disclosure.

FIG. 12 shows an example of a process for reading data from a memory device according to aspects of the present disclosure. In some examples, these operations may be performed by a system including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At operation 1200, the system reads a block of data from a memory device. In some cases, the operations of this step may refer to, or be performed by, a memory controller as described with reference to FIG. 6.

At operation 1205, the system processes the block of data using EM signal processing to classify each bit of the block of data with an LLR value. In some cases, the operations of this step may refer to, or be performed by, an EM signal processing component as described with reference to FIG. 6.

At operation 1210, the system decodes the block of data based on a constrained coding scheme. In some cases, the operations of this step may refer to, or be performed by, a constrained channel decoder as described with reference to FIG. 6.

At operation 1215, the system decodes the block of data based on an ECC coding scheme. In some cases, the operations of this step may refer to, or be performed by, an ECC decoder as described with reference to FIG. 6.

Figure 13:
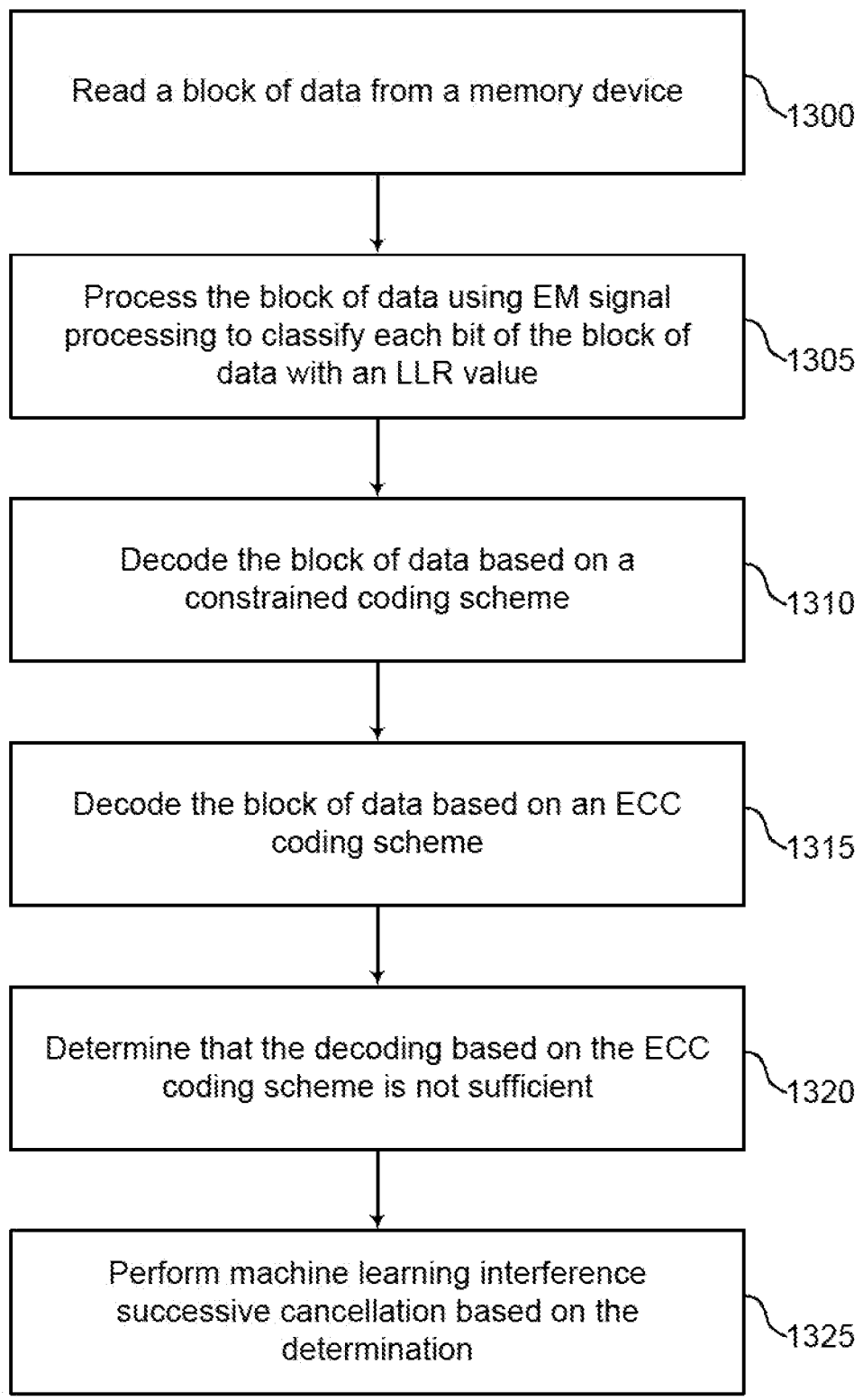
FIG. 13 shows an example of a process for performing interference cancellation according to aspects of the present disclosure.

FIG. 13 shows an example of a process for performing interference cancellation according to aspects of the present disclosure. In some examples, these operations may be performed by a system including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At operation 1300, the system reads a block of data from a memory device. In some cases, the operations of this step may refer to, or be performed by, a memory controller as described with reference to FIG. 6.

At operation 1305, the system processes the block of data using EM signal processing to classify each bit of the block of data with an LLR value. In some cases, the operations of this step may refer to, or be performed by, an EM signal processing component as described with reference to FIG. 6.

At operation 1310, the system decodes the block of data based on a constrained coding scheme. In some cases, the operations of this step may refer to, or be performed by, a constrained channel decoder as described with reference to FIG. 6.

At operation 1315, the system decodes the block of data based on an ECC coding scheme. In some cases, the operations of this step may refer to, or be performed by, an ECC decoder as described with reference to FIG. 6.

At operation 1320, the system determines that the decoding based on the ECC coding scheme is not sufficient. In some cases, the operations of this step may refer to, or be performed by, a machine learning interference successive cancellation component as described with reference to FIG. 6.

At operation 1325, the system performs machine learning interference successive cancellation based on the determination. In some cases, the operations of this step may refer to, or be performed by, a machine learning interference successive cancellation component as described with reference to FIG. 6.

Figure 14:
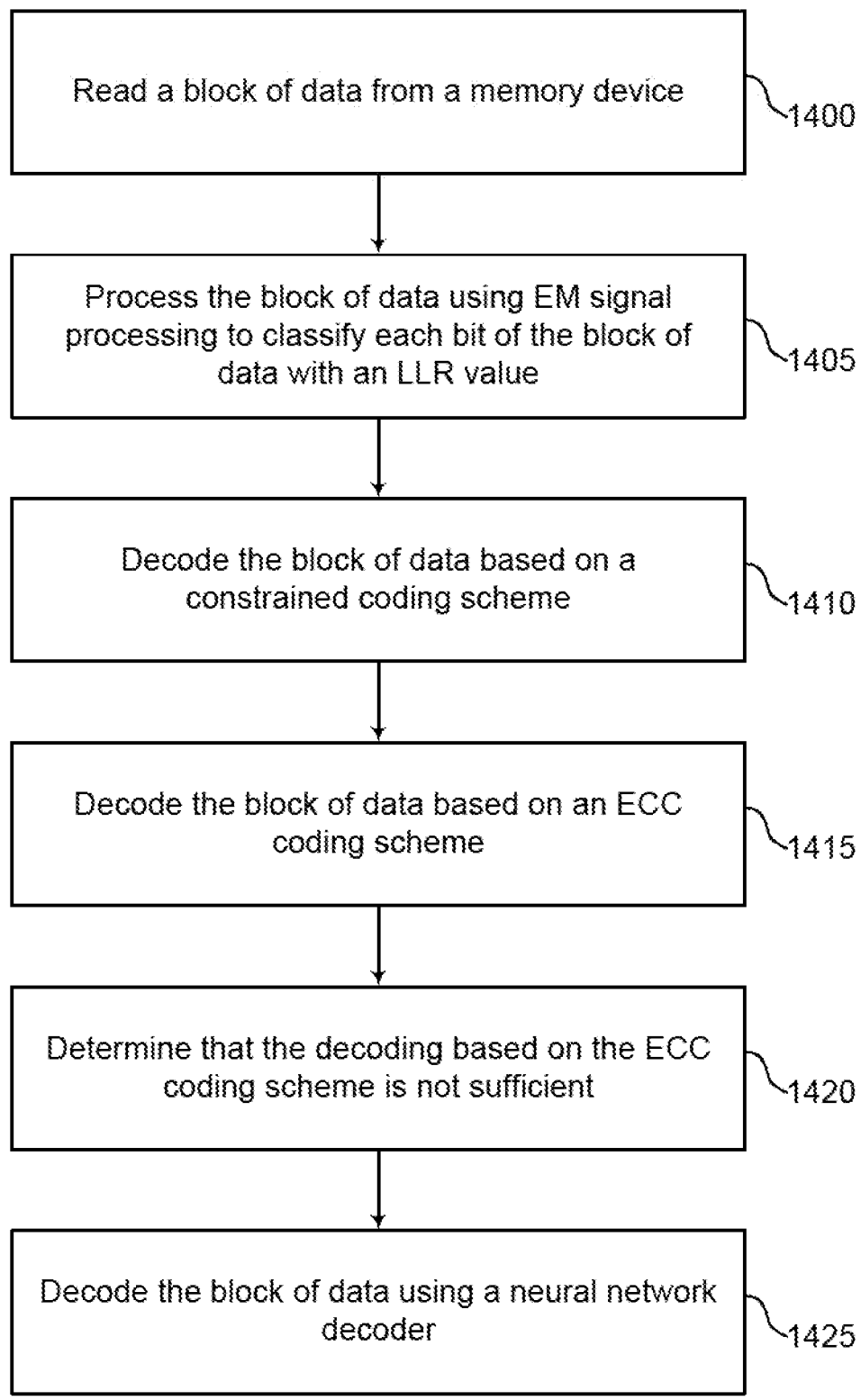
FIG. 14 shows an example of a process for performing neural network decoding according to aspects of the present disclosure.

FIG. 14 shows an example of a process for performing neural network decoding according to aspects of the present disclosure. In some examples, these operations may be performed by a system including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At operation 1400, the system reads a block of data from a memory device. In some cases, the operations of this step may refer to, or be performed by, a memory controller as described with reference to FIG. 6.

At operation 1405, the system processes the block of data using EM signal processing to classify each bit of the block of data with an LLR value. In some cases, the operations of this step may refer to, or be performed by, an EM signal processing component as described with reference to FIG. 6.

At operation 1410, the system decodes the block of data based on a constrained coding scheme. In some cases, the operations of this step may refer to, or be performed by, a constrained channel decoder as described with reference to FIG. 6.

At operation 1415, the system decodes the block of data based on an ECC coding scheme. In some cases, the operations of this step may refer to, or be performed by, an ECC decoder as described with reference to FIG. 6.

At operation 1420, the system determines that the decoding based on the ECC coding scheme is not sufficient. In some cases, the operations of this step may refer to, or be performed by, a neural network decoder as described with reference to FIGS. 6 and 10.

At operation 1425, the system decodes the block of data using a neural network decoder. In some cases, the operations of this step may refer to, or be performed by, a neural network decoder as described with reference to FIGS. 6 and 10.

Accordingly, the present disclosure includes the following embodiments.

A mobile electronic device for data storage for a mobile device is described. Embodiments of the mobile electronic device may include a memory device, a memory controller comprising a processor and an internal memory and configured to operate the memory device, an error correction code (ECC) encoder configured to encode data for programming to the memory device, a constrained channel encoder configured to encode an output of the ECC encoder based on one or more constraints for programming to the memory device, a reinforcement learning pulse programming (RLPP) component configured to identify a programming algorithm for programming the data to the memory device, an expectation maximization (EM) signal processing component configured to receive a noisy multi-wordline voltage vector from the memory device and classify each bit of the vector with a log likelihood ration (LLR) value, a constrained channel decoder configured to receive a constrained vector from the EM signal processing component and produce an unconstrained vector, and an ECC decoder configured to decode the unconstrained vector.

In some examples, the ECC encoder is configured to encode the data using an S-polar coding scheme that incorporates a Reed Solomon (RS) coding scheme and a polar coding scheme. In some examples, the ECC encoder comprises a reduced frame size and a reduced redundancy level configured for a mobile architecture. In some examples, the constrained channel encoder is configured to identify data from a next wordline of the memory device prior to encoding the output of the ECC encoder for a current wordline of the memory device.

In some examples, the RLPP component comprises a wordline agent, a level agent, and a block agent. In some examples, the EM signal processing component is configured to provide the LLR value to the ECC decoder. In some examples, the EM signal processing component is configured based on a reduced sample size for a mobile architecture.

Some examples of the mobile electronic device and method described above may further include a machine learning interference successive cancellation component configured to receive a noisy wordline vector from the ECC decoder and provide a de-noised wordline vector to the ECC decoder.

Some examples of the mobile electronic device and method described above may further include a neural network decoder configured to receive a wordline data vector and a wordline voltage vector and produce a recovered data vector. In some examples, the neural network decoder comprises a reduced number of nodes, wherein the reduced number of nodes is selected for a mobile architecture.

In some examples, each cell of the memory device comprises a 5-bit or 6-bit NAND flash memory cell. In some examples, the memory controller comprises a simplified memory controller architecture configured for reduced power consumption.

A method for data storage for a mobile device is described. Embodiments of the method may include receiving a block of data, encoding the block of data based on an ECC coding scheme, encoding the block of data based on a constrained coding scheme, and programming the encoded block of data to a memory device using RLPP.

In some examples, the ECC coding scheme comprises an S-polar coding scheme that incorporates an RS coding scheme and a polar coding scheme. Some examples of the method described above may further include identifying data from a next wordline of the memory device, wherein the constrained coding scheme is based on the data from the next wordline.

A method for data storage for a mobile device is described. Embodiments of the method may include reading a block of data from a memory device, processing the block of data using EM signal processing to classify each bit of the block of data with an LLR value, decoding the block of data based on a constrained coding scheme, and decoding the block of data based on an ECC coding scheme.

In some examples, the ECC coding scheme comprises an S-polar coding scheme that incorporates an RS coding scheme and a polar coding scheme. In some examples, the decoding the block of data based on the ECC coding scheme is performed based at least in part on the LLR value.

Some examples of the method described above may further include determining that the decoding based on the ECC coding scheme is not sufficient. Some examples may further include performing machine learning interference successive cancellation based on the determination. Some examples of the method described above may further include determining that the decoding based on the ECC coding scheme is not sufficient. Some examples may further include decoding the block of data using a neural network decoder.

The description and drawings described herein represent example configurations and do not represent all the implementations within the scope of the claims. For example, the operations and steps may be rearranged, combined or otherwise modified. Also, structures and devices may be represented in the form of block diagrams to represent the relationship between components and avoid obscuring the described concepts. Similar components or features may have the same name but may have different reference numbers corresponding to different figures.

Some modifications to the disclosure may be readily apparent to those skilled in the art, and the principles defined herein may be applied to other variations without departing from the scope of the disclosure. Thus, the disclosure is not limited to the examples and designs described herein, but is to be accorded the broadest scope consistent with the principles and novel features disclosed herein.

The described methods may be implemented or performed by devices that include a general-purpose processor, a digital signal processor (DSP), an application specific integrated circuit (ASIC), a field programmable gate array (FPGA) or other programmable logic device, discrete gate or transistor logic, discrete hardware components, or any combination thereof. A general-purpose processor may be a microprocessor, a conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Thus, the functions described herein may be implemented in hardware or software and may be executed by a processor, firmware, or any combination thereof. If implemented in software executed by a processor, the functions may be stored in the form of instructions or code on a computer-readable medium.

Computer-readable media includes both non-transitory computer storage media and communication media including any medium that facilitates transfer of code or data. A non-transitory storage medium may be any available medium that can be accessed by a computer. For example, non-transitory computer-readable media can comprise random access memory (RAM), read-only memory (ROM), electrically erasable programmable read-only memory (EEPROM), compact disk (CD) or other optical disk storage, magnetic disk storage, or any other non-transitory medium for carrying or storing data or code.

Also, connecting components may be properly termed computer-readable media. For example, if code or data is transmitted from a website, server, or other remote source using a coaxial cable, fiber optic cable, twisted pair, digital subscriber line (DSL), or wireless technology such as infrared, radio, or microwave signals, then the coaxial cable, fiber optic cable, twisted pair, DSL, or wireless technology are included in the definition of medium. Combinations of media are also included within the scope of computer-readable media.

In this disclosure and the following claims, the word "or" indicates an inclusive list such that, for example, the list of X, Y, or Z means X or Y or Z or XY or XZ or YZ or XYZ. Also the phrase "based on" is not used to represent a closed set of conditions. For example, a step that is described as "based on condition A" may be based on both condition A and condition B. In other words, the phrase "based on" shall be construed to mean "based at least in part on." Also, the words "a" or "an" indicate "at least one."

What is claimed is:

1. A mobile electronic device, comprising:
a memory device;
a memory controller comprising a processor and an internal memory and configured to operate the memory device by storing data in the memory device and retrieving the data from the memory device, wherein the memory controller further comprises:
an error correction code (ECC) encoder configured to encode the data for programming to the memory device to obtain encoded data;
a constrained channel encoder configured to encode the encoded data-based on one or more constraints for programming to the memory device to obtain a constrained vector;

a reinforcement learning pulse programming (RLPP) component configured to identify a programming algorithm for programming the data to the memory device using reinforcement learning, wherein the memory controller stores the data into the memory device by programming the constrained vector in the memory device using the programming algorithm;

a constrained channel decoder configured to receive the constrained vector that is programmed in the memory device and produce an unconstrained vector based on the one or more constraints; and an ECC decoder configured to decode the unconstrained vector to obtain a decoded vector, wherein the memory controller retrieves the data from the memory device based on the decoded vector.

2. The mobile electronic device of claim 1, wherein:
the ECC encoder is configured to encode the data using an S-polar coding scheme that incorporates a Reed Solomon (RS) coding scheme and a polar coding scheme.

3. The mobile electronic device of claim 2, wherein:
the ECC encoder comprises a reduced frame size and a reduced redundancy level configured for a mobile architecture.

4. The mobile electronic device of claim 1, wherein:
the constrained channel encoder is configured to identify a next wordline from a buffer of the memory device, and to encode a current wordline of the encoded data based on the next wordline to obtain the constrained vector.

5. The mobile electronic device of claim 1, wherein:
the RLPP component comprises a wordline agent, a level agent, and a block agent that are trained based on a wordline algorithm reward, a level algorithm reward, and a block algorithm reward.

6. The mobile electronic device of claim 1, further comprising:
an expectation maximization (EM) signal processing component configured to receive a noisy multi-wordline voltage vector from the memory device and classify each bit of the noisy multi-wordline voltage vector with a log likelihood ration (LLR) value.

7. The mobile electronic device of claim 6, further comprising:
the EM signal processing component is configured based on a reduced sample size for a mobile architecture.

8. The mobile electronic device of claim 1, further comprising:

a machine learning interference successive cancellation component configured to receive a noisy wordline vector from the ECC decoder and provide a de-noised wordline vector to the ECC decoder.

9. The mobile electronic device of claim 8, wherein:
the machine learning interference successive cancellation component operates based on input from an EM signal processing component.

10. The mobile electronic device of claim 1, further comprising:
a neural network decoder configured to receive a wordline data vector of the encoded data and a wordline voltage vector from the memory device and produce a recovered data vector.

11. The mobile electronic device of claim 10, wherein:
the neural network decoder comprises a reduced number of nodes, wherein the reduced number of nodes is selected for a mobile architecture.

12. The mobile electronic device of claim 1, wherein:
each cell of the memory device comprises a 5-bit or 6-bit NAND flash memory cell.

13. A method for programming data to a memory device, the method comprising:
receiving a block of data;
encoding the block of data based on an error correction code (ECC) coding scheme to obtain encoded data;
encoding the encoded data based on a constrained coding scheme to obtain constrained data; and
identifying a programming algorithm for programming the data to the memory device, wherein the programming algorithm is identified using reinforcement learning pulse programming (RLPP),
storing the encoded block of data in the memory device using a memory controller by programming the constrained data into the memory device based on the identified programming algorithm.

14. The method of claim 13, wherein:
the ECC coding scheme comprises an S-polar coding scheme that incorporates a Reed Solomon (RS) coding scheme and a polar coding scheme.

15. The method of claim 13, further comprising:
identifying data from a next wordline of the memory device, wherein the constrained coding scheme is based on the identified data from the next wordline.

* * * * *